(12) United States Patent
Premutico et al.

(10) Patent No.: US 8,981,363 B1
(45) Date of Patent: Mar. 17, 2015

(54) FLEXIBLE SUBSTRATE FOR OLED DEVICE

(71) Applicant: Universal Display Corporation, Ewing, NJ (US)

(72) Inventors: Mauro Premutico, Brooklyn, NY (US); Ruiqing Ma, Morristown, NJ (US); Chun Lin, Yardley, PA (US); Michael Hack, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/016,478

(22) Filed: Sep. 3, 2013

(51) Int. Cl.
*H01L 51/00* (2006.01)
*H01L 27/32* (2006.01)
*H01L 51/56* (2006.01)

(52) U.S. Cl.
CPC ............ *H01L 51/0097* (2013.01); *H01L 27/32* (2013.01); *H01L 51/56* (2013.01); *H01L 27/323* (2013.01); *H01L 27/3225* (2013.01); *H01L 27/3206* (2013.01)
USPC ..................... 257/40; 257/59; 257/72; 438/99

(58) Field of Classification Search
CPC .... H01L 51/0097; H01L 51/56; H01L 27/323
USPC .................................. 257/40, 59, 72; 438/99
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |

(Continued)

FOREIGN PATENT DOCUMENTS

| | | |
|---|---|---|
| WO | 2008057394 | 5/2008 |
| WO | 2010011390 | 1/2010 |

OTHER PUBLICATIONS

Baldo, et al., "Highly efficient phosphorescent emission from organic electroluminescent devices", Nature, vol. 395, pp. 151-154, 1998.

(Continued)

*Primary Examiner* — Tu-Tu Ho
(74) *Attorney, Agent, or Firm* — Morris & Kamlay LLP

(57) ABSTRACT

Flexible substrates and devices including flexible substrates are provided. In an embodiment, a flexible substrate includes a first glass substrate material and a first organic light emitting device, disposed over the first flexible substrate, which includes a first emissive layer The first flexible substrate may have a thickness of not more than 300 μm, a flexural rigidity of $10^{-1}$ Nm to $10^{-6}$ Nm, a water vapor transmission rate of not more than $10^{-6}$ g per square meter per day, a refractive index of not more than 1.6, a glass transition temperature of at least 300 C, a Young's modulus of 60 to 90 GPa, and/or an optical transmission of at least 85% for light in the range of 400 to 800 nm.

64 Claims, 4 Drawing Sheets

(56) References Cited

U.S. PATENT DOCUMENTS

| | | |
|---|---|---|
| 6,337,102 B1 | 1/2002 | Forrest et al. |
| 6,468,819 B1 | 10/2002 | Kim et al. |
| 7,279,704 B2 | 10/2007 | Walters et al. |
| 7,431,968 B1 | 10/2008 | Shtein et al. |
| 7,557,367 B2 * | 7/2009 | Rogers et al. .............. 257/9 |
| 7,968,146 B2 | 6/2011 | Wagner et al. |
| 2003/0230980 A1 | 12/2003 | Forrest et al. |
| 2004/0174116 A1 | 9/2004 | Lu et al. |
| 2013/0146875 A1 * | 6/2013 | Mandlik et al. .............. 257/52 |

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.

Corning, "Willow Glass", Fact Sheet, 2003.

* cited by examiner

FLEXIBLE SUBSTRATE FOR OLED DEVICE

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices and, more specifically, to flexible substrates suitable for use with organic light emitting devices and related products.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

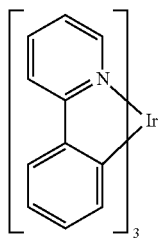

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

Flexible substrates and devices including flexible substrates are provided.

In an embodiment, a first device includes a first flexible substrate that includes a first glass substrate material and a first organic light emitting device, disposed over the first flexible substrate, which includes a first emissive layer having a first phosphorescent emissive material. The first flexible substrate may have a thickness of not more than 300 µm, not more than 200 µm, not more than 100 µm, not more than 50 µm, not more than 30 µm, and/or at least 6 µm. The first glass substrate material has a flexural rigidity of $10^{-1}$ Nm to $10^{-6}$ Nm or not more than about $10^{-1}$ Nm to $10^{-4}$ Nm, a water vapor transmission rate of not more than $10^{-6}$ g per square meter per day, a refractive index of not more than 1.6, not more than 1.5, not more than 1.4, or not less than 1.3, a glass transition temperature of at least 300 C, at least 400 C, or at least 500 C, a Young's modulus of 60 to 90 GPa, and/or an optical transmission of at least 85% for light in the range of 400 to 800 nm. The first glass substrate material may include a borosilicate glass.

The first organic light emitting device may white light, and the first emissive material may emit light having a peak wavelength in the visible spectrum of 530 nm to 580 nm. The first device may include a second organic light emitting device disposed over the first flexible substrate, which emits light having a peak wavelength in the visible spectrum of 500-600 nm, and which comprises a second emissive layer having a phosphorescent second emissive material. The first organic light emitting device may emit light having a peak wavelength in the visible spectrum of 600-700 nm. The second emissive layer may include a first host material and a second host material.

The first device may include a third organic light emitting device disposed over the first flexible substrate, which emits light having a peak wavelength in the visible spectrum of 400-500 nm, and which includes a third emissive layer having a third emitting material which may be fluorescent or phosphorescent. A fourth organic light emitting device may be disposed over the first flexible substrate, which emits light having a peak wavelength in the visible spectrum of 400-500 nm, and which includes a fourth emissive layer having a fourth emissive material with a peak wavelength in the visible spectrum of light that is at least 4 nm less than the peak wavelength in the visible spectrum of light emitted by the third organic light emitting device.

The first device may include a barrier layer disposed over the first organic light emitting device, which may include a mixture of a polymeric material and a non-polymeric material. The barrier layer may cover at least a portion of an edge of the flexible substrate and at least a portion of a side of each of the flexible substrate and the organic light emitting device. At least a portion of the side of the organic light emitting device may be disposed within approximately 3 mm from the edge of the substrate.

A second flexible substrate may be disposed over the first organic light emitting device. The second flexible substrate may have a thickness of not more than 300 µm, not more than 200 µm, not more than 100 µm, not more than 50 µm, not more than 30 µm, and/or at least 6 µm. The first glass substrate material has a flexural rigidity of $10^{-1}$ Nm to $10^{-6}$ Nm or not more than about $10^{-1}$ Nm to $10^{-4}$ Nm, a water vapor transmission rate of not more than $10^{-6}$ g per square meter per day, a refractive index of not more than 1.6, not more than 1.5, not more than 1.4, or not less than 1.3, a glass transition temperature of at least 300 C, at least 400 C, or at least 500 C, a Young's modulus of 60 to 90 GPa, and/or an optical transmission of at least 85% for light in the range of 400 to 800 nm.

The second flexible substrate may include a material that is the same as a material in the first flexible substrate.

The first device may be a consumer product, a lighting panel, a rollable display or other display, or a rollable lighting device. It may include a touch sensitive surface, a color filter, and/or an outcoupling component in optical communication with the organic light emitting device.

The organic light emitting device may be transparent, and may be top-emitting or bottom-emitting.

The first device may include at least one thin film transistor (TFT) electrically connected to the first organic light emitting device, and configured to be flexible with the substrate. It may include one or more of a timing component, a power source, a controller, a computer-readable memory element, and logic circuitry. All external electrical connections for the first device may be disposed on one edge of the device.

The first device may have a total thickness of not more than 500 µm or not more than 1,000 µm.

The first device may have a bending length of about 1.0 cm to about 30.0 cm or about 3.0 cm to about 15.0 cm.

A method of manufacturing a first device according to an embodiment may include obtaining a first flexible substrate comprising a first glass substrate material, and disposing a first organic light emitting device over the first flexible substrate, where the first organic light emitting device includes a first emissive layer having a first phosphorescent emissive material. The first flexible substrate may have a thickness of not more than 300 µm, not more than 200 µm, not more than 100 µm, not more than 50 µm, not more than 30 µm, and/or at least 6 µm. The first glass substrate material has a flexural rigidity of $10^{-1}$ Nm to $10^{-6}$ Nm or not more than about $10^{-1}$ Nm to $10^{-4}$ Nm, a water vapor transmission rate of not more than $10^{-6}$ g per square meter per day, a refractive index of not more than 1.6, not more than 1.5, not more than 1.4, or not less than 1.3, a glass transition temperature of at least 300 C, at least 400 C, or at least 500 C, a Young's modulus of 60 to 90 GPa, and/or an optical transmission of at least 85% for light in the range of 400 to 800 nm. The first flexible substrate may be maintained in a planar configuration while the first organic light emitting device is disposed over the first flexible substrate, such as by applying a tension to the first flexible substrate to maintain the first flexible substrate in the planar configuration. The first organic light emitting device may be deposited via a roll to roll process, where the roller design is supported by the flexural rigidity of the first flexible substrate.

In an embodiment, a portable data communication device may include a flexible OLED display panel. The flexible OLED panel may include a first flexible glass substrate comprising a first glass substrate material, a second flexible glass substrate, and an OLED device disposed between the first flexible glass substrate and the second flexible glass substrate. The first flexible glass substrate and/or the second flexible glass substrate each may have a thickness of not more than 300 µm, not more than 200 µm, not more than 100 µm, not more than 50 µm, not more than 30 µm, and/or at least 6 µm. The first glass substrate material has a flexural rigidity of $10^{-1}$ Nm to $10^{-6}$ Nm or not more than about $10^{-1}$ Nm to $10^{-4}$ Nm, a water vapor transmission rate of not more than $10^{-6}$ g per square meter per day, a refractive index of not more than 1.6, not more than 1.5, not more than 1.4, or not less than 1.3, a glass transition temperature of at least 300 C, at least 400 C, or at least 500 C, a Young's modulus of 60 to 90 GPa, and/or an optical transmission of at least 85% for light in the range of 400 to 800 nm.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
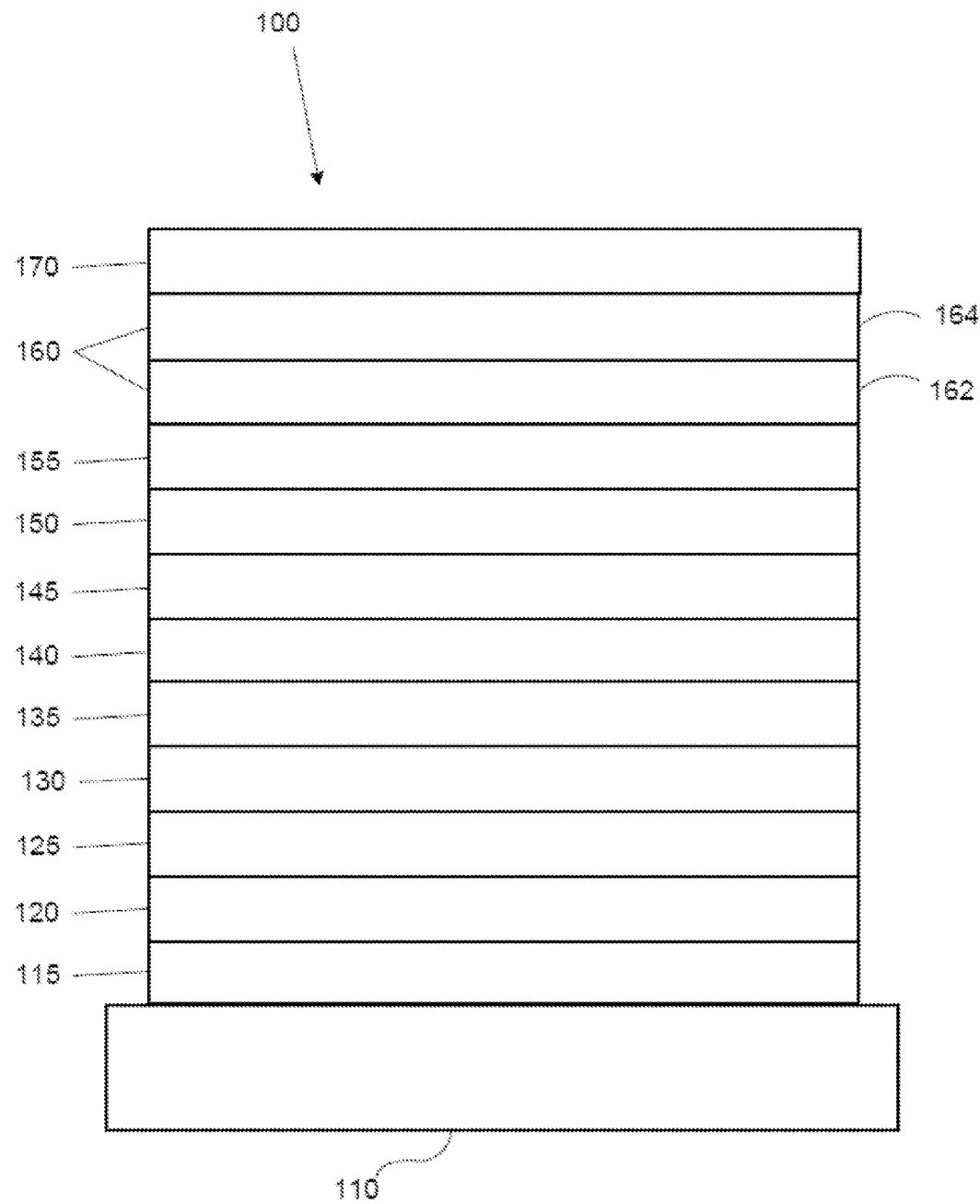
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
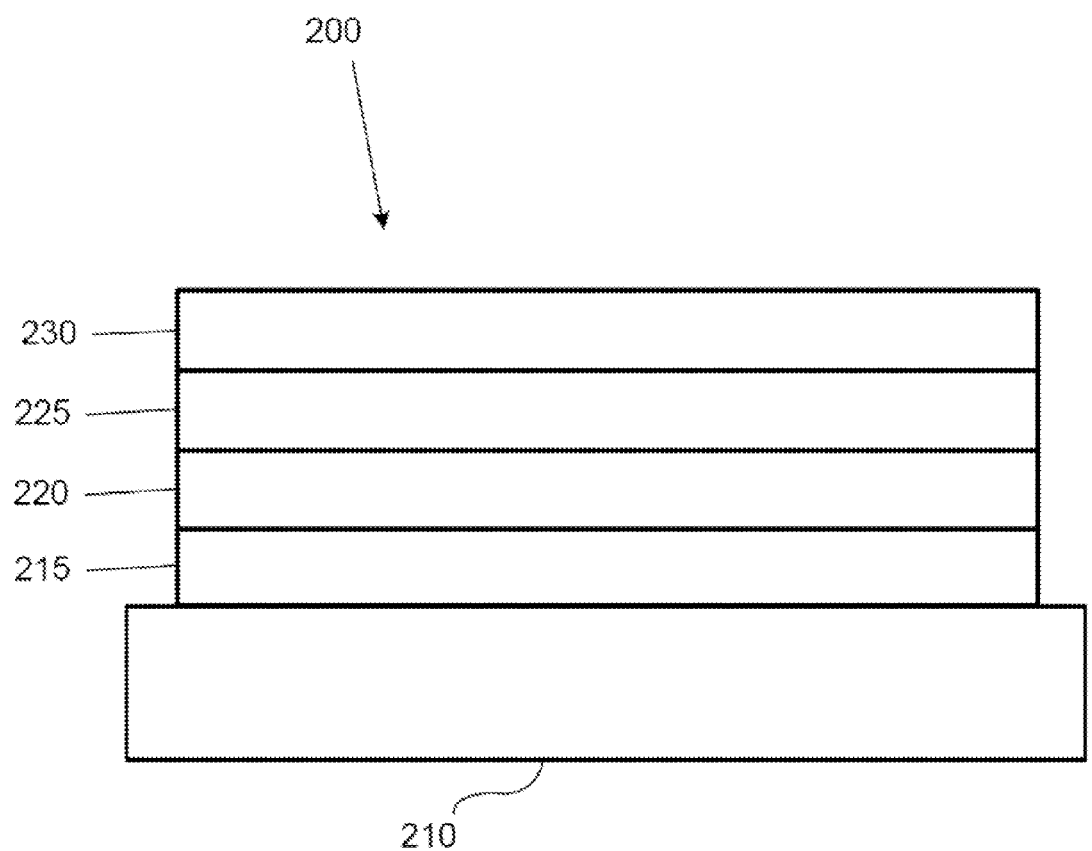
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, aralkyl, heterocyclic group, aryl, aromatic group, and heteroaryl are known to the art, and are defined in U.S. Pat. No. 7,279,704 at cols. 31-32, which are incorporated herein by reference.

OLEDs may be manufactured using a variety of materials, and may be designed to provide a variety of features and benefits. The attributes of those materials may vary widely; however, in some cases only a relatively small portion of the full attribute range for a specific material may be suitable for use in an OLED. For example, various material families may have specific materials with a wide range of glass transition temperatures. However, some OLED implementations may require relatively high glass transition temperatures, thus making some materials in the family less suitable or unsuitable for use in those implementations. In particular the fabrication of high quality thin film transistors often requires deposition temperatures above 250° C. Similarly, selecting an appropriate combination of materials to achieve an OLED with desired flexibility, optical characteristics, efficiency, and other attributes, may be difficult due to the interaction of the various materials and their individual properties. For example, it may be desirable to use various glass substrate materials in certain OLED applications, including flexible OLEDs. However, some glass substrate materials may be too rigid or brittle to allow for use in flexible OLEDs, or, if they have suitable flexibility, may have undesirable optical characteristics. Thus, there is a need for suitable combinations of materials and material properties for use in flexible and other OLED applications.

In many applications, it may be desirable to use a glass substrate, or a substrate that includes one or more glass layers. Glass may be beneficial, for example, because an encapsulation layer may not be needed for the device, or the entire device may not need to be encapsulated. Depositing transistors on an encapsulation barrier can be difficult because the transistors often require a high temperature environment to deposit. Glass generally allows for the use of higher-performance transistors, and a greater range of materials may be available to use for fabrication of the transistors, which may improve structural stability. Further, components that otherwise may be disposed externally relative to the main OLED device may be incorporated into the internal structure of the device when glass is used. However, glass materials may be more difficult to incorporate into a flexible device relative to other substrate materials.

In a typical bottom-emission OLED, a transparent anode, often formed of transparent conductive oxide (TCO), such as ITO and IZO, is deposited on the substrate, followed by the organic layers. Light generated in the emissive layer emits into air through TCO and substrate. Such a device may be modeled as a three-layer system by using ITO as example (ITO, substrate, and air), in which there are two interfaces that will generate reflective loss. The reflection loss $R_{12}$ at the interface between $n_1$ and $n_2$, for a normally incident light, is equal to $$R_{12}=(n_1-n_2)^2/(n_1+n_2)^2$$

The refractive index of ITO is 1.9216 at 550 nm. In the case of $n_1$=1.9216 and $n_2$=1.0 (air), the loss is 10%. When a third material with an index of $n_3$, where $n_1 > n_3 > n_2$, is used, the reflection loss can be estimated as $$R_{132}=(n_1-n_3)^2/(n_1+n_3)^2+(n_3-n_2)^2/(n_3+n_2)^2$$

Figure 3:
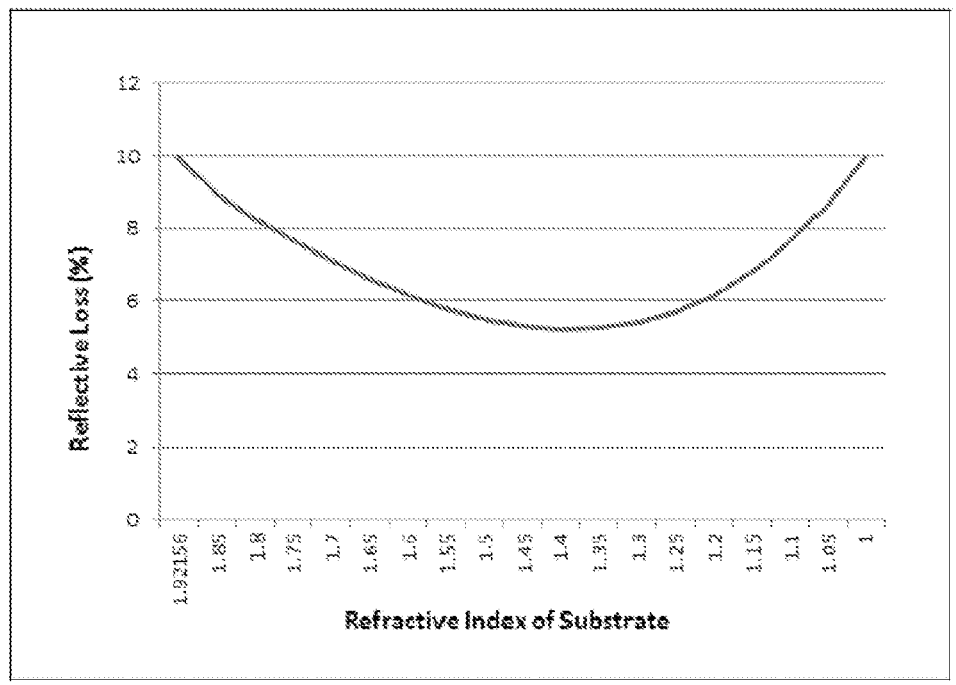
FIG. 3 shows a reflective loss function.

The reflective loss as a function of $n_3$ and the resulting curve is shown in FIG. 3. As shown in FIG. 3, the reflective loss is minimized when the refractive index of the substrate is between 1.25 And 1.55, and, preferably, between 1.3 and 1.5.

The glass transition temperature also may be of interest when selecting materials for use in a flexible OLED. It is known that TFTs processed at high temperatures (e.g., 300 C or higher) typically have better performance. So a substrate material with a high glass transition temperature (Tg) may be desirable for flexible backplanes. More specifically, for high performance flexible AMOLED displays, a Tg of higher than 300 C, more preferably 400 C or 500 C, may be desirable. For flexible OLEDs that don't require TFTs, such as flexible passive matrix display or flexible OLED lighting devices, a relatively high Tg also may be desirable. For example, for non-TFT OLEDs devices, a patterned insulating layer typically may be used to cover bus-lines and define active areas. Wet processes typically are preferred due to relatively low cost and fast throughput. However, in a wet process the material often needs to be baked at high temperature to remove the moisture. A substrate with a low Tg limits the ability to effectively treat the insulating material, and may resulting degrading the devices once OLEDs are deposited. In such a configuration, a substrate with a Tg of 300 C or higher may be preferred.

Another factor to consider when selecting materials for use in an OLED is the flexibility and thickness relationship of the material. This may be particularly relevant for substrate materials. If the substrate is too rigid, it will not flex easily. Similarly, if the substrate is too flexible, it will collapse and thus may require extra support when disposed in a flat state. A useful measure of the balance between flexibility and rigidity is flexural rigidity. As used herein, "flexural rigidity" refers to the force couple required to bend a rigid structure to a unit curvature. For a uniform substrate, flexural rigidity can be described mathematically as:

$$D=Et^3/12(1-\mu^2) \quad (1)$$

where D is flexural rigidity (in Nm), E is Young's modulus (in $Nm^{-2}$), $\mu$ is Poisson's ratio and t is the thickness of the substrate (in m). This equation is described in J. A. Rogers, G. R. Bogart, J. Mater. Res., 16 (1), 217, 2001. In general, the more flexible the substrate is, the lower the flexural rigidity of the substrate. The flexural rigidity of any substrate can be theoretically calculated if Young's modulus, Poisson's ratio and the thickness of the substrate are known.

In some cases, it may be relatively difficult to calculate flexural rigidity for thin films from material properties or from data provided in a textbook or material property reference. This may be especially true for composite films or multilayer films. However, once a measurement is made for a particular structure, flexural rigidity can be readily altered in a reasonably predictable way by one of skill in the art by adjusting parameters such as substrate thickness. For example, a cantilever method, in which a fixed angle flexometer is used to determine flexural rigidity. A rectangular strip of material is supported on a horizontal platform in a direction perpendicular to the edge of the platform. The strip is extended in the direction of its length so that an increasing part overhangs and bends down under its own weight. When the tip of the strip of material has reached a plane passing through the edge of the platform and inclined at an angle of $\theta$=41.5° below the horizontal, the overhanging length L is equal to twice the bending length C of the specimen (C=0.5 L at $\theta$=41.5°).

The bending length (in m) is denoted by C, where C is the cube root of the ratio of flexural rigidity to the weight per unit area of the material: $D=WC^3$, where W is weight per unit area (in $N \cdot m^{-2}$), which for a uniform strip is given by $W=\rho tg$, such that:

$$D=WC^3=\rho tgC^3 \quad (2)$$

where $\rho$ is density (in $kgm^{-3}$), g is gravitation acceleration (9.81 $ms^{-2}$) and t is the thickness of the substrate (in m). Equations 1 and 2 may be used to determine a suitable substrate material/thickness combination to be used for making flexible electronics devices. In table 1, E, $\mu$, and $\rho$ are material properties and are determined once the material is selected.

TABLE 1

|  | E (G Pa) | $\mu$ | t (mm) | D | $\rho$ (Kg/m3) | g (m/s2) | C (m) |
|---|---|---|---|---|---|---|---|
| stainless steel | 200 | 0.3 | 0.075 | 0.008491 | 8020 | 9.81 | 0.112897 |
| PET | 2.5 | 0.35 | 0.3 | 0.007305 | 1380 | 9.81 | 0.121615 |
| PET | 2.5 | 0.35 | 0.15 | 0.000913 | 1380 | 9.81 | 0.076613 |
| Borosilicate Glass | 65 | 0.2 | 0.26 | 0.103302 | 2230 | 9.81 | 0.262858 |
| Borosilicate Glass | 65 | 0.2 | 0.1 | 0.005877 | 2230 | 9.81 | 0.139018 |
| Borosilicate Glass | 65 | 0.2 | 0.05 | 0.000735 | 2230 | 9.81 | 0.087576 |
| Borosilicate Glass | 65 | 0.2 | 0.006 | 1.27E−06 | 2230 | 9.81 | 0.021306 |

It has been found that, to ensure sufficient flexibility, the bending length of a glass substrate should be less than a typical dimension of a device in which the substrate is used. For example, in an embodiment, the bending length of the device is about 1.0 cm to about 30.0 cm. In another embodiment, the bending length of the first device is about 3.0 cm to about 15.0 cm. In an embodiment, the first device has a flexural rigidity of about $10^{-1}$ Nm to about $10^{-6}$ Nm. In an embodiment, the thickness of the substrate is 300 micrometer or less. It has been found that borosilicate glass may provide suitable flexibility, as shown in the chart above. Although borosilicate glass is shown for reference, it will be understood that other substrate materials, including other glass substrate materials, may be used without departing from the scope or content of the claims presented herein.

In various embodiments of the present invention, a substrate suitable for use with an OLED may have the various properties disclosed above. More specifically, it may be desirable for the substrate to be a flexible substrate that includes a glass substrate material having these properties. More generally, as used herein, when a substrate or substrate material is described, it will be understood that any properties of a substrate material may apply equally to a substrate as a whole. As a specific example, where properties are described for a flexible glass substrate material, a substrate made entirely of that material would necessarily have the same properties. However, a substrate that incorporates additional materials also may have the same properties as described for the single substrate material.

Figure 4:
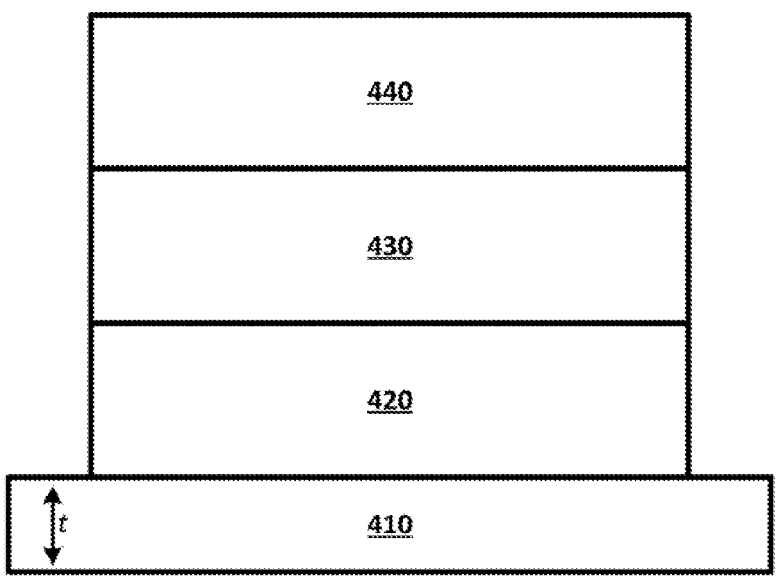
FIG. 4 shows an example device that includes a flexible substrate.

In an embodiment, a device such as an OLED as disclosed herein may include a flexible substrate that is made of, or includes, a glass substrate material. FIG. 4 shows an example device that includes a flexible substrate 410. One or more OLEDs 420 may be disposed over the flexible substrate, such as OLEDs including one or more phosphorescent emissive layers as disclosed herein. The flexible substrate may have a thickness t of not more than 300 µm, not more than 200 µm, not more than 100 µm, not more than 50 µm, or not more than 30 µm, and may be at least 6 µm. In general, the OLED may have any structure and include any layers disclosed herein, such as the layers and structures described with respect to FIGS. 1-2.

The glass substrate material may be selected to have various physical properties. For example, it may have a flexural rigidity of $10^{-1}$ Nm to $10^{-6}$ Nm or not more than about $10^{-1}$ Nm to $10^{-4}$ Nm, a water vapor transmission rate of not more than $10^{-6}$ g per square meter per day (g/m$^2$/day), and/or a glass transition temperature of at least 300 C, at least 400 C, or at least 500 C. Other properties may be used to select the glass substrate material. For example, the glass substrate material may have a Young's modulus in the range of 60-90 GPa. It also may be selected to have various optical properties. For example, the glass substrate material may have a refractive index within a desired range, such as not more than 1.6, not more than 1.5, not less than 1.3, or the like. It also may have an optical transmission of at least 85% for light in the range of 400 to 800 nm, or other desirable range. The use of a flexible glass substrate material having some or all of these properties may allow for a flexible device to be fabricated as previously disclosed, while still obtaining the benefits of a glass substrate. As a specific example, the glass substrate material may be, or include, a borosilicate glass. As previously described, the flexible substrate may include one or more layers that have the disclosed properties, or the substrate as a whole may have these properties.

In an embodiment, the OLED 420 may be configured to emit any desired light or combination of light. For example, the OLED may emit white light, i.e., light that has significant contributions from multiple portions of the visible region of the spectrum, such that it appears generally white or appears not to have a predominant other color to the human eye. White light as disclosed herein may include light of any temperature, such that it may be "warm" or "cool" white light. It also may have an inexact balance of color from the various regions of the visible spectrum so that, for example, it may appear slightly blue, slightly red, slightly green, slightly yellow, or the like. For purposes of the present disclosure, such light may still be considered "white" light. Typically, white light may be filtered or otherwise modified to produce a desired color, such as by incorporating a red filter to produce red light.

In some embodiments, a device such as described with respect to FIG. 4 may include a color filter or other similar layer that is disposed in optical communication with the OLED, to allow for color filtering of the light emitted by the OLED. The device may include other optical components, such as one or more outcoupling components disposed in optical communication with the OLED, to improve outcoupling of light emitted by the OLED.

Light emitted by the OLED, whether single-color or white light, may include light having one or more peaks in the visible emission spectrum. For example, the OLED may emit light having one or more peak wavelengths in the visible spectrum in the region of 400-500 nm, 530-580 nm, 500-600 nm, and/or 600-700 nm.

As previously described, any OLED structure and/or any suitable combination of layers as disclosed herein may be used in embodiments of the invention. For example, the OLED may include one or multiple emissive layers, each of which may be the same or may be different, such as where different layers emit light having different emission spectra. Each emissive layer in the OLED may be fluorescent or phosphorescent. Each layer also may have one or more host materials and one or more dopant materials. As a specific example, the OLED may include three emissive layers, two of which are fluorescent and one of which is phosphorescent, or two of which are phosphorescent and one of which is fluorescent.

In an embodiment, a device as described with respect to FIG. 4 may include one or more additional OLEDs 420 in addition to the first OLED 410. Each additional OLED 420 may include any of the structures and/or layers as described with respect to the first OLED 410. In some configurations, additional OLEDs 430 may include emissive layers and/or spectra which are complementary to those of the first OLED 420 and/or any other OLEDs in the device. For example, in an embodiment an OLED may produce an emission spectrum having a peak wavelength that is at least 4 nm less than a peak wavelength emitted by another OLED in the device. Where multiple OLEDs are used, they may be disposed in a stack or stacked architecture such as shown in FIG. 4, or they may be disposed in other arrangements known in the art.

As a specific example, a device as described with respect to FIG. 4 may include a first OLED, such as OLED 420 in FIG. 4 that emits light having a peak wavelength in the visible spectrum in the range of 600-700 nm, and a second OLED such as OLED 430 disposed over the first OLED. The second OLED may emit light having a peak wavelength in the visible spectrum of 500-600 nm, and may include a phosphorescent emissive material. A third phosphorescent OLED 440 that emits light in the visible spectrum of 400-500 nm may be disposed over the flexible substrate. Additional OLEDs and/or layers may be disposed over the phosphorescent OLED 440, such as a fourth OLED that emits light having a peak wavelength in the range of 400-500 nm, which is at least 4 nm less than the peak wavelength of the third OLED 440. This specific arrangement is provided by way of illustration only, and, as previously disclosed, other combinations of OLEDs, emissive layers, and optical properties may be used without deviating from the scope or content of the present claims.

Figure 5:
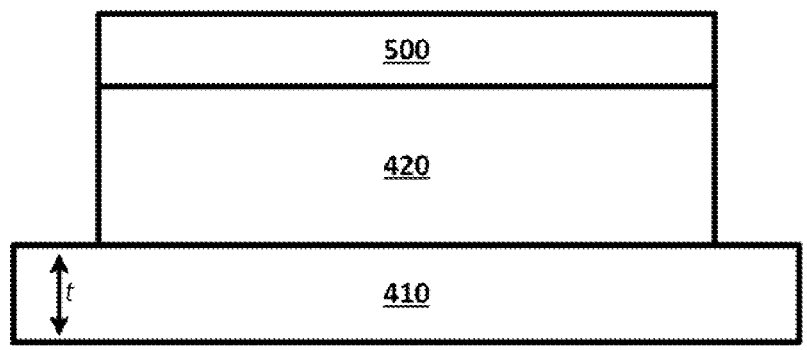
FIG. 5 shows an example device that includes a flexible substrate.

In an embodiment, a second flexible substrate may be disposed over one or more OLEDs in a device. FIG. 5 shows an example device structure in which a second flexible substrate 500 is disposed over an OLED 420 and a first flexible substrate. The second flexible substrate 500 may include any of the properties and materials previously described with respect to the first flexible substrate 410. For example, it may have a flexural rigidity of $10^{-1}$ Nm to $10^{-6}$ Nm or not more than about $10^{-1}$ Nm to $10^{-4}$ Nm, a water vapor transmission rate of not more than $10^{-6}$ g per square meter per day (g/m²/day), a glass transition temperature of at least 300 C, at least 400 C, or at least 500 C, and/or a Young's modulus in the range of 60-90 GPa. As previously described with respect to the first flexible substrate 410, the second flexible substrate 500 may have a refractive index of not more than 1.6, not more than 1.5, not less than 1.3, or the like, an optical transmission of at least 85% for light in the range of 400 to 800 nm, or other desirable range. More generally, the second flexible substrate may be or include the same material as the first flexible substrate 410, such as a borosilicate glass, or it may be a different material. Other layers and components, such as additional OLEDs as disclosed with respect to FIG. 4, may be disposed over the second flexible substrate.

In an embodiment, a device may include a barrier layer disposed over one or more OLEDs, such as the OLEDs 420, 430, 440 described with respect to FIGS. 4-5. The barrier layer may include polymeric and/or non-polymeric materials, and/or a mixture of polymeric and non-polymeric materials. In some configurations, the barrier layer may cover at least a portion of each of at least one edge and side of the flexible substrate. It also may cover one or more additional edges of the substrate. It also may cover at least a portion of the OLED and/or the substrate, including in configurations in which the OLED is disposed relatively close to an edge of the substrate. For example, a side of the OLED may be disposed within about 3 mm of an edge of the substrate, though the barrier layer may still cover at least a portion of each of the OLED and the substrate. Similarly, the barrier layer may cover at least a portion of multiple OLEDs, such as where a side of each OLED in a stacked configuration is covered by the barrier layer.

As previously described, the use of a flexible glass substrate may allow for electrical connections, component arrangement, and similar configurations that would otherwise be difficult or impossible to achieve with other types of substrates. For example, in an embodiment a device as described with respect to FIGS. 4-5 may include one or more thin film transistors (TFTs) that are electrically connected to one or more organic light emitting devices, and which are flexible with the substrate. As another example, in an embodiment all external electrical connections for the device may be disposed on a single edge of the device, for example along the left edge of the device shown in FIG. 4. Various electrical components which otherwise may be disposed externally to the device also may be incorporated into the device itself, such as timing components, power sources, controllers, computer-readable memory, and logic circuitry. Other components may be integrated with the device as well. In some configurations, one or more components may be integral with the device while others are maintained as external components.

The use of a flexible substrate as disclosed herein may provide other physical benefits to the overall device as well. For example, relatively thin flexible devices may be achieved. In some embodiments, the total thickness of a device as disclosed in FIGS. 4-5 may be less than about 500 µm, less than about 1000 µm, or any other suitable thickness. As another example, relatively flexible devices may be achieved, such as a device as disclosed with respect to FIGS. 4-5 that has a bending length of 1.0-30.0 cm, or about 3.0 cm to about 15.0 cm.

Devices disclosed herein may be fabricated by obtaining a flexible substrate that includes a glass substrate material as previously described, and depositing the appropriate layers in order over the substrate. For example, an OLED may be deposited over the flexible substrate by depositing the various component layers of the OLED using techniques known in the art. In some configurations, the use of a flexible glass substrate as disclosed herein may allow for additional fabrication techniques that would otherwise be impractical, difficult, or destructive to use with other substrate materials. For example, the substrate may be held in a planar configuration while the OLED is disposed over the substrate, such as by applying tension to the substrate to hold the substrate in a planar configuration. In contrast to other conventional substrates, such tension may not damage or otherwise undesirably affect a substrate as disclosed herein. As another example, one or more OLEDs may be deposited over the substrate using a roll-to-roll process. In this case, the flexural rigidity of the flexible substrate as disclosed herein may provide support for the roller design in the roll-to-roll process. For example, a substrate with large flexural rigidity needs a large roller in order to maintain its integrity and prevent breakage. Embodiments disclosed herein may allow for relatively smaller rolls than would otherwise be feasible, thus reducing the space and complexity required to fabricate devices using a roll-to-roll process.

Embodiments of the invention may include, or be incorporated into, a variety of devices and products. For example, a device as disclosed herein may be incorporated into a consumer product, a lighting panel, a rollable display or other display, a rollable lighting device, a touch sensitive surface, or combinations thereof. More specifically, a device as disclosed herein may include a flexible layer that is touch sensitive. When the device is touched and/or a similar force is exerted upon a region of the device, the device may produce an electrical signal. The signal may, for example, be used to determine the location of the touch or similar force on the device, to provide an electrical signal within or externally to the device, or the like. For example, the signal may be received by a processor incorporated in, or in communication with, the device, which may then perform additional processing based upon the signal. The general operation of a touch-sensitive surface is otherwise known in the art, and embodiments disclosed herein allow for corresponding touch-sensitive features within a flexible device as disclosed. Embodiments also may be constructed to have various properties or arrangements suitable for incorporation into such devices. For example, a device as disclosed herein may be transparent, and may be top-emitting, bottom-emitting, or both.

As a specific example, a device as disclosed herein may be incorporated into a portable data communication device having a flexible OLED display panel. The flexible OLED panel may include a flexible glass substrate having a glass substrate material, as disclosed herein, and a second flexible substrate, such as a glass substrate as disclosed herein. The flexible glass substrate may have some or all of the properties previously described, including a thickness of not more than 300 µm or less, a flexural rigidity of $10^{-1}$ Nm to $10^{-6}$ Nm, a water vapor transmission rate of not more than $10^{-6}$ g/m²/day, a refractive index of not more than 1.5, and/or a glass transition temperature of at least 300 C. Similarly, the second flexible substrate may be a glass substrate having some or all of the properties previously described, and may be the same material as the flexible glass substrate. An OLED device as previously disclosed herein may be disposed between the flexible glass substrate and the second flexible substrate.

Another specific example of an application for which embodiments of this invention may be particularly useful is advertising signage which can be installed on curved walls and around circular columns that are present in most retail stores. The ability to provide a flexible display that is relatively thin, attractive and durable, provides for a display platform that can be used to deliver targeted advertising and updated data to consumers that are walking around a retail facility. In a preferred embodiment of the present invention, a flexible OLED display of the present invention is attached to a circular column at a retail facility. The display is connected to a power source and a communication device for receiving updated advertising and display data. The communication device can be wired or wireless. In a preferred embodiment of the present invention, the power circuitry, communication device and consumer interchange electronics and mechanical assembly are connected to one of the edges of the display signage. The two ends of the signage may then be connected to a wall mount or to each other in order to provide a fixed position on a curved wall for the display. The consumer interchange components can be used to provide a consumer feedback mechanism for delivering print or electronic coupons in ways that are well known in the art. The device enables retailers to utilize limited and valuable space within the store, generate additional revenue on otherwise limited space and directly communicate with consumers and enhance the consumer experience.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A first device comprising:
   a first flexible substrate comprising a first glass substrate material; and
   a first organic light emitting device, disposed over the first flexible substrate, comprising a first emissive layer having a first phosphorescent emissive material;
   wherein the first flexible substrate has a thickness of not more than 300 µm; and
      wherein the first glass substrate material has a flexural rigidity of $10^{-1}$ Nm to $10^{-6}$ Nm and a water vapor transmission rate of not more than $10^{-6}$ g per square meter per day.

2. The first device of claim 1, further comprising a communication device configured to receive consumer information.

3. The first device of claim 1, further comprising a mechanical mount suitable for attaching the device to a curved support surface.

4. The first device of claim 1, wherein the first glass substrate material has a refractive index of not more than 1.6.

5. The first device of claim 4, wherein the first glass substrate material has a refractive index of not more than 1.5.

6. The first device of claim 1, wherein the first glass substrate material has an optical transmission of at least 85% for light in the range of 400 to 800 nm.

7. The first device of claim 1, wherein the first glass substrate material has a glass transition temperature of at least 300° C.

8. The first device of claim 1, wherein the first glass substrate material comprises a borosilicate glass.

9. The first device of claim 1, wherein the first glass substrate material has a thickness of not more than 200 µm.

10. The first device of claim 1, wherein the first flexible substrate has a thickness of not more than 100 µm.

11. The first device of claim 10, wherein the first flexible substrate has a thickness of not more than 50 µm.

12. The first device of claim 11, wherein the first flexible substrate has a thickness of not more than 30 µm.

13. The first device of claim 1, wherein the first flexible substrate has a thickness of at least 6 µm.

14. The first device of claim 1, wherein the first glass substrate material has a refractive index of at least 1.3.

15. The first device of claim 1, wherein the first glass substrate material has a glass transition temperature of at least 400° C.

16. The first device of claim 1, wherein the first glass substrate material has a glass transition temperature of at least 500° C.

17. The first device of claim 1, wherein the first glass substrate material has a flexural rigidity of not more than about $10^{-1}$ Nm to $10^{-4}$ Nm.

18. The first device of claim 1, wherein the first glass substrate material has a Young's modulus of 60 to 90 GPa.

19. The first device of claim 1, wherein the first organic light emitting device emits white light, and wherein the first emissive material emits light having a peak wavelength in the visible spectrum of 530 nm to 580 nm.

20. The first device of claim 1, further comprising a second organic light emitting device disposed over the first flexible substrate, which emits light having a peak wavelength in the visible spectrum of 500-600 nm;
   wherein the second organic light emitting device comprises a second emissive layer having a phosphorescent second emissive material.

21. The first device of claim 20, wherein the first organic light emitting device emits light having a peak wavelength in the visible spectrum of 600-700 nm.

22. The first device of claim 21, wherein the second emissive layer further comprises a first host material and a second host material.

23. The first device of claim 21, further comprising a third organic light emitting device disposed over the first flexible substrate, which emits light having a peak wavelength in the visible spectrum of 400-500 nm;
   wherein the third organic light emitting device comprises a third emissive layer having a third emitting material.

24. The first device of claim 23, wherein the third emitting material is fluorescent.

25. The first device of claim 23, wherein the third emitting material is phosphorescent.

26. The first device of claim 25, further comprises a fourth organic light emitting device disposed over the first flexible substrate, which emits light having a peak wavelength in the visible spectrum of 400-500 nm;
   wherein the fourth organic light emitting device comprises a fourth emissive layer having a fourth emissive material; and
   wherein the peak wavelength in the visible spectrum of light emitted by the fourth organic light emitting device is at least 4 nm less than the peak wavelength in the visible spectrum of light emitted by the third organic light emitting device.

27. The first device of claim 1, wherein the first device further comprises a barrier layer disposed over the first organic light emitting device.

28. The first device of claim 27, wherein the barrier layer comprises a mixture of a polymeric material and a non-polymeric material.

29. The first device of claim 27, wherein the first flexible substrate has a first surface, a first side, and a first edge where the first surface meets the first side;

wherein the first organic light emitting device has a second side;

wherein at least a portion of the second side is disposed within approximately 3 mm from the first edge; and wherein the barrier layer covers at least a portion of the first edge, at least a portion of the first side, and at least the a portion of the second side.

30. The first device of claim 1, wherein the first device further comprises a second flexible substrate disposed over the first organic light emitting device.

31. The first device of claim 1, further comprising a flexible layer that is touch sensitive and can produce an electrical signal in response to a touch action received by the flexible layer.

32. The first device of claim 30, wherein the second flexible substrate has a thickness of not more than 300 μm.

33. The first device of claim 30, wherein the second flexible substrate comprises a second glass substrate material having a flexural rigidity of $10^{-1}$ Nm to $10^{-6}$ Nm and a water vapor transmission rate of not more than $10^{-6}$ g per square meter per day.

34. The first device of claim 33, wherein the second glass substrate material comprises a borosilicate glass.

35. The first device of claim 30, wherein the second glass substrate material is the same material as the first substrate glass material.

36. The first device of claim 1, wherein the first device further comprises a second organic light emitting device disposed in a stack over the first organic light emitting device.

37. The first device of claim 1, wherein the first device is a consumer product.

38. The first device of claim 1, wherein the first device comprises a lighting panel.

39. The first device of claim 1, wherein the first device is a rollable display or a rollable lighting device.

40. The first device of claim 1, further comprising a color filter in optical communication with the first organic light emitting device.

41. The first device of claim 1, further comprising a touch sensitive surface.

42. The first device of claim 1, further comprising an outcoupling component in optical communication with the first organic light emitting device.

43. The first device of claim 1, wherein the first device is a display.

44. The first device of claim 1, further comprising at least one thin film transistor (TFT) electrically connected to the first organic light emitting device, and configured to be flexible with the substrate.

45. The first device of claim 1, wherein the first device is transparent.

46. The first device of claim 1, wherein the first organic light emitting device is a top-emitting device.

47. The first device of claim 1, wherein the first organic light emitting device is a bottom-emitting device.

48. The first device of claim 1, wherein all external electrical connections for the first device are disposed on one edge of the device.

49. The first device of claim 1, wherein the first device has a total thickness of not more than 500 μm.

50. The first device of claim 1, wherein the first device has a total thickness of not more than 1,000 μm.

51. The first device of claim 1, further comprising at least one electrical component selected from the group consisting of a timing component, a power source, a controller, a computer-readable memory element, and logic circuitry.

52. The first device of claim 1, wherein the first device has a bending length of about 1.0 cm to about 30.0 cm.

53. The first device of claim 52, wherein the first device has a bending length of about 3.0 cm to about 15.0 cm.

54. A consumer information display panel, comprising:
the first device of claim 1;
a communication module configured to receive updated consumer information; and
a mounting component suitable for attaching the consumer information display panel to a curved support surface.

55. The consumer information display panel of claim 54, further comprising a consumer interchange interface configured to receive information from a user.

56. A method of manufacturing a first device, said method comprising:
obtaining a first flexible substrate comprising a first glass substrate material; and
disposing a first organic light emitting device over the first flexible substrate, the first organic light emitting device comprising a first emissive layer having a first phosphorescent emissive material;
wherein the first flexible substrate has a thickness of not more than 300 μm; and
wherein the first glass substrate material has a flexural rigidity of $10^{-1}$ Nm to $10^{-6}$ Nm and a water vapor transmission rate of not more than $10^{-6}$ g per square meter per day.

57. The method of claim 56, further comprising maintaining the first flexible substrate in a planar configuration while the step of disposing the first organic light emitting device over the first flexible substrate is performed.

58. The method of claim 57, further comprising applying a tension to the first flexible substrate to maintain the first flexible substrate in the planar configuration.

59. The method of claim 57, wherein at least a portion of the first organic light emitting device is deposited via a roll to roll process, and the roller design is supported by the flexural rigidity of the first flexible substrate.

60. A portable data communication device having a flexible OLED display panel, the flexible OLED panel comprising:
a first flexible glass substrate comprising a first glass substrate material;
a second flexible glass substrate;
an OLED device disposed between the first flexible glass substrate and the second flexible glass substrate;
wherein the first flexible substrate has a thickness of not more than 300 μm; and
wherein the first glass substrate material has a flexural rigidity of $10^{-1}$ Nm to $10^{-6}$ Nm and a water vapor transmission rate of not more than $10^{-6}$ g per square meter per day.

61. The portable data communication device of claim 60, wherein the second glass substrate material is the same material as the first glass substrate material.

62. The portable data communication device of claim 60, wherein the second glass substrate material has a flexural rigidity of $10^{-1}$ Nm to $10^{-6}$ Nm and a water vapor transmission rate of not more than $10^{-6}$ g per square meter per day.

63. The portable data communication device of claim 60, wherein the first glass substrate material has a refractive index of not more than 1.5.

64. The portable data communication device of claim 60, wherein the first glass substrate material has a glass transition temperature of at least 300° C.

* * * * *